United States Patent
Cho et al.

(10) Patent No.: US 7,571,376 B2
(45) Date of Patent: Aug. 4, 2009

(54) VITERBI DECODER FOR EXECUTING TRACE-BACK WORK IN PARALLEL AND DECODING METHOD

(75) Inventors: Yeon-gon Cho, Sowon-si (KR);
Jun-haeng Cho, Seongnam-si (KR);
Dong-won Kwak, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 555 days.

(21) Appl. No.: 11/340,490

(22) Filed: Jan. 27, 2006

(65) Prior Publication Data
US 2006/0168501 A1 Jul. 27, 2006

(30) Foreign Application Priority Data
Jan. 27, 2005 (KR) .................. 10-2005-0007565

(51) Int. Cl.
*H03M 13/03* (2006.01)
(52) U.S. Cl. .................. 714/795; 714/794; 714/796; 375/262; 375/341
(58) Field of Classification Search .............. 714/795, 714/755, 794, 799, 718, 763, 772, 796; 375/262, 375/341
See application file for complete search history.

(56) References Cited
U.S. PATENT DOCUMENTS
6,304,617 B1 * 10/2001 Okamoto .................. 375/341
6,738,941 B1 * 5/2004 Todoroki .................. 714/755
7,263,652 B2 * 8/2007 Zaboronski et al. ......... 714/794
7,331,013 B2 * 2/2008 Rudosky et al. ............. 714/795
2005/0149838 A1 * 7/2005 Chiueh et al. ............... 714/795

FOREIGN PATENT DOCUMENTS
KR 10-2004-0050754 A 6/2004

\* cited by examiner

*Primary Examiner*—Esaw T Abraham
*Assistant Examiner*—Fritz Alphonse
(74) *Attorney, Agent, or Firm*—Sughrue Mion, PLLC (57) ABSTRACT

A Viterbi decoder for executing a trace-back work in parallel and a decoding method. The Viterbi decoder includes a branch metric calculator which calculates a branch metric from a branch code passing each state on a trellis diagram and a predetermined input code, at least one adder/comparator/selector which adds the branch metric to a path metric of a previous state, detects a minimum value of the addition result values as a path metric of a current state, and detects state transition values corresponding to a path from which the minimum value has been detected, a path metric memory which stores the path metric detected by the at least one adder/comparator/selector, a plurality of trace-back memories which sequentially store the state transition values detected by the at least one adder/comparator/selector, and if the plurality of trace-back memories store the state transition values by a preset trace-back depth, a trace-back controller executes a trace-back work in parallel in each of the plurality of trace-back memories.

14 Claims, 6 Drawing Sheets

VITERBI DECODER FOR EXECUTING TRACE-BACK WORK IN PARALLEL AND DECODING METHOD

CROSS-REFERENCE TO RELATED APPLICATIONS

This application claims priority from Korean Patent Application No. 10-2005-0007565 filed Jan. 27, 2005, in the Korean Intellectual Property Office, the entire disclosure of which is incorporated herein by reference.

BACKGROUND OF THE INVENTION

1. Field of the Invention

Apparatuses and methods consistent with the present invention relate to a Viterbi decoder and a decoding method, and more particularly, to a Viterbi decoder executing a trace-back work in parallel using a plurality of memories connected to one another in parallel so as to improve a decoding speed and a decoding method.

2. Description of the Related Art

With the development of communication technology, wireless mobile communication technology has been popularized all over the world. Data is transmitted and/or received wirelessly in such a wireless mobile communication environment. Thus, data may be distorted by an effect such as noise during a transmission of the data. In general, to reduce the possibility of such a distortion, the transmitter codes and transmits data to be transmitted, and the receiver decodes the data. Also, coding and decoding works are executed during storing of data from a recording medium such as a digital versatile disc (DVD).

Such a coding method may be of various types such as a block coding method, a convolution coding method, and the like. In the block coding method, additional data with a predetermined bit size is added to an input data bit and then coded. In the convolution coding method, previously input data is stored in a memory to perform coding based on a correlation between a current input value and a previous input value. Compared to the block coding method, the convolution coding method has high error correction efficiency and thus is generally used.

A Viterbi decoder decodes data coded using the convolutional coding method. The Viterbi decoder performs a multi-step operation, accumulates the result of the multi-step operation, and determines an optimum path from the accumulated result values so as to correct an error.

Figure 1:
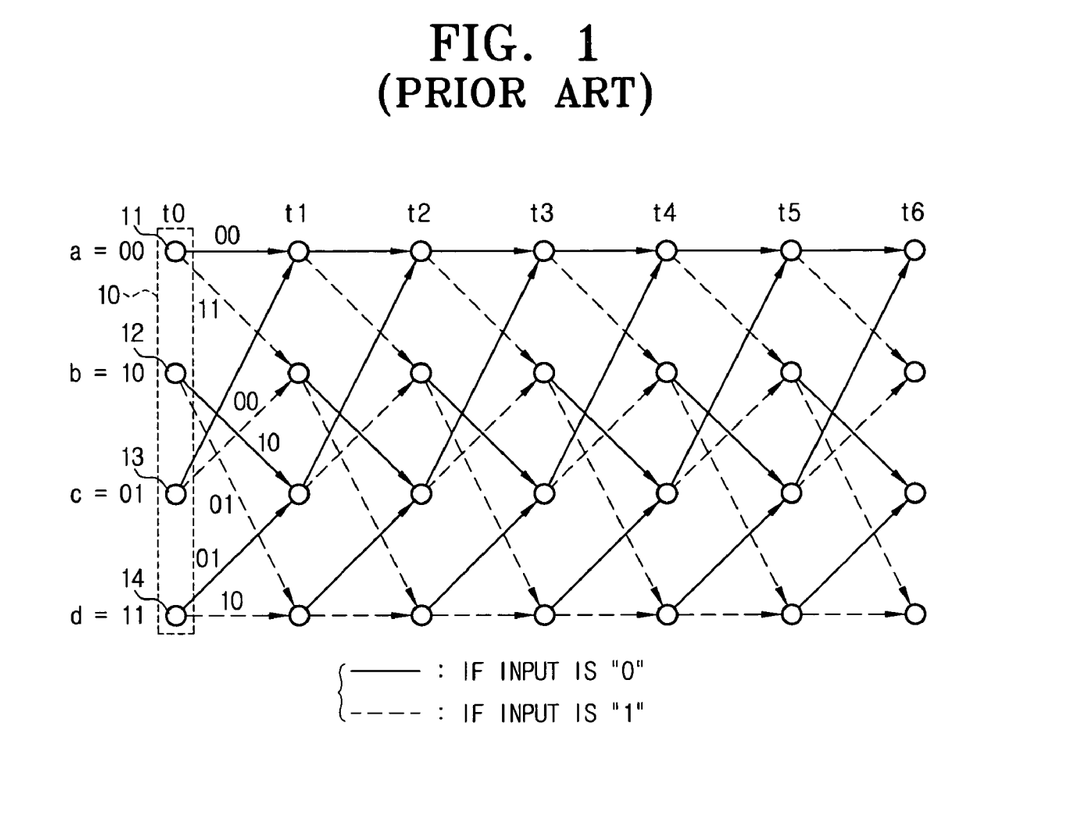
FIG. 1 is a schematic view of a trellis diagram.

FIG. 1 is a schematic view of a trellis diagram used in a general Viterbi decoder. In the trellis diagram shown in FIG. 1, a constraint length K is "3," and a coding rate is "½." The trellis diagram includes a plurality of processing nodes corresponding to lapses of time, and a processing node 10 of the plurality of processing nodes includes a plurality of states 11 through 14.

Since the constraint length K is "3," the trellis diagram includes $2^{3-1}=4$ states. Each of the states is assigned previously input bit values, i.e., bit values such as "00," "10," "01," and "11." The Viterbi decoder calculates a path metric using a distance between an inherent code assigned to each branch on the trellis diagram and a substantially input signal as a branch metric. The path metric is stored in a memory. Thus, if a final path metric is stored, a trace-back work is executed. In other words, a minimum value of the final path metric is selected so that a trace-back work is performed starting from a first state in which the minimum value is recorded. A path metric of a state of states of a previous processing node connected to the first state is checked. Thus, a path in which the checked path metric is minimum is selected as an optimum path. As a result, if the selected optimum path has passed branches marked with solid lines, the selected optimum path is decoded as "0." If the selected optimum path has passed branches marked with dotted lines, the selected optimum path is decoded as "1."

A trace-back of decoding steps of the Viterbi decoder greatly affects power consumption and decoding time. A conventional Viterbi decoder executes such a trace-back process using various methods.

In a first type of trace-back work, the trace-back work is executed whenever each of the bits is decoded. In other words, if a trace-back memory includes 64 trace-back memory cells and 64 input values are input to calculate path metrics, the trace-back work is executed stating from the $64^{th}$ memory cell. Thus, the first input value is decoded. Since the memory cells of the track-back memory have circulating structures, a path metric corresponding to a next input value is recorded in a decoded memory cell. Thereafter, the track-back work is executed stating from the first memory cell to decode the second input value. As a result, the 64 input values are sequentially decoded stating from the first input value. However, according to this method, since the trace-back work is executed with respect to each of the bits, a large amount of power is consumed.

In a second type of trace-back work, a capacitance of a trace-back memory may be increased. In this case, information as to state transition values obtained from a previous trace-back step is stored in the trace-back memory. Thus, if a point of time when an optimum path traced back in a current step coincides with an optimum path traced back in a previous step, the trace-back work in the current step stops and decoding may be executed using the optimum path traced back in the previous step.

In other words, if the trace-back work is executed up to a predetermined length or more, a point converging into a path through which a previous track-back work has been executed is detected. In this case, the trace-back work is not executed starting from the converging point but decoding may be immediately performed. Thus, although a value of an input signal received prior to the converging point is not traced back, the value may be decoded at a time. As a result, a number of times trace-back work is performed may be reduced, which reduces power consumption. However, according to this method, after decoding is performed one time, a time delay occurs until decoding is performed the next time. Therefore, this method may not be used in the fields requiring high speed decoding.

SUMMARY OF THE INVENTION

Accordingly, an aspect of the present invention is to provide a Viterbi decoder executing a trace-back work in parallel using a plurality of trace-back memories so as to reduce power consumption and improve a decoding speed and a decoding method.

According to an aspect of the present invention, there is provided a Viterbi decoder including: a branch metric calculator calculating a branch metric from a branch code passing each state on a trellis diagram and a predetermined input code; at least one adder/comparator/selector adding the branch metric to a path metric of a previous state, detecting a minimum value of the addition result values as a path metric of a current state, and detecting state transition values corresponding to a path from which the minimum value has been detected; a path metric memory storing the path metric detected by the at least one adder/comparator/selector; a plurality of trace-back memories sequentially storing the state transition values detected by the at least one adder/comparator/selector; and a trace-back controller executing a trace-back work in parallel in each of the plurality of trace-back memories if the plurality of trace-back memories store the state transition values by a preset trace-back depth.

The trace-back controller may detect states having a minimum path metric from the plurality of trace-back memories to execute the trace-back work from the detected states.

If the trace-back controller executes the trace-back work in a first trace-back memory of the plurality of trace-back memories, the trace-back controller may refer to state transition values stored in the other trace-back memories except the first trace-back memory.

The Viterbi decoder may further include: if the trace-back work is executed in each of the plurality of trace-back memories to decode predetermined data sequences, a data arranger arranging the predetermined data sequences in a predetermined order to generate a final decoding value.

Each of the plurality of trace-back memories may include: a first memory bank in which a decoding work is executed; second and third memory banks in which the trace-back work is executed; and a fourth memory bank storing state transition values corresponding to input codes received after the trace-back work is executed.

If the trace-back work is executed in each of the plurality of trace-back memories by a preset decoding depth, the trace-back controller may stop the trace-back work and execute a decoding work starting from a point of time when the trace-back work stops.

If a constraint length is K, a maximum number of the plurality of trace-back memories may be K−3.

According to another aspect of the present invention, there is provided a decoding method executed by a Viterbi decoder including a plurality of trace-back memories, including: calculating a branch metric from a branch code passing each state on a trellis diagram and a predetermined input code; adding the branch metric to a path metric of a previous state and detecting a minimum value of the addition result values as a path metric of a current state; detecting state transition values corresponding to a path from which the minimum value has been detected; sequentially storing the state transition values in the plurality of trace-back memories; and if the state transition values are stored in the plurality of trace-back memories by a preset trace-back depth, executing a trace-back work in parallel in each of the plurality of trace-back memories States having a minimum path metric may be detected from each of the plurality of trace-back memories to execute the trace-back work from the detected states.

If the trace-back work is executed in a first trace-back memory of the plurality of trace-back memories, state transition values stored in the other trace-back memories except the first trace-back memory may be referred to.

The decoding method may further include: if the trace-back work is executed in each of the plurality of trace-back memories by a preset decoding depth, stopping the trace-back work and executing a decoding work starting from a point of time when the trace-back work stops.

The decoding method may further include: if the trace-back work is executed in each of the plurality of trace-back memories to decode predetermined data sequences, arranging the predetermined data sequences in a predetermined order to generate a final decoding value.

Each of the plurality of trace-back memories may include: a first memory bank in which a decoding work is executed; second and third memory banks in which the trace-back work is executed; and a fourth memory bank storing state transition values corresponding to input codes received after the trace-back work is executed. In particular, if a constraint length is K, a maximum number of the plurality of trace-back memories may be K−3.

BRIEF DESCRIPTION OF THE DRAWINGS

The above and other aspects of the present invention will be more apparent by describing exemplary embodiments of the present invention with reference to the accompanying drawings, in which.

DETAILED DESCRIPTION OF EXEMPLARY EMBODIMENTS

Exemplary embodiments of the present invention will be described in greater detail with reference to the accompanying drawings.

In the following description, same drawing reference numerals are used for the same elements even in different drawings. The matters defined in the description such as a detailed construction and elements are nothing but the ones provided to assist in a comprehensive understanding of the invention. Thus, it is apparent that the present invention can be carried out without those defined matters. Also, well-known functions or constructions are not described in detail since they would obscure the invention in unnecessary detail.

Figure 2:
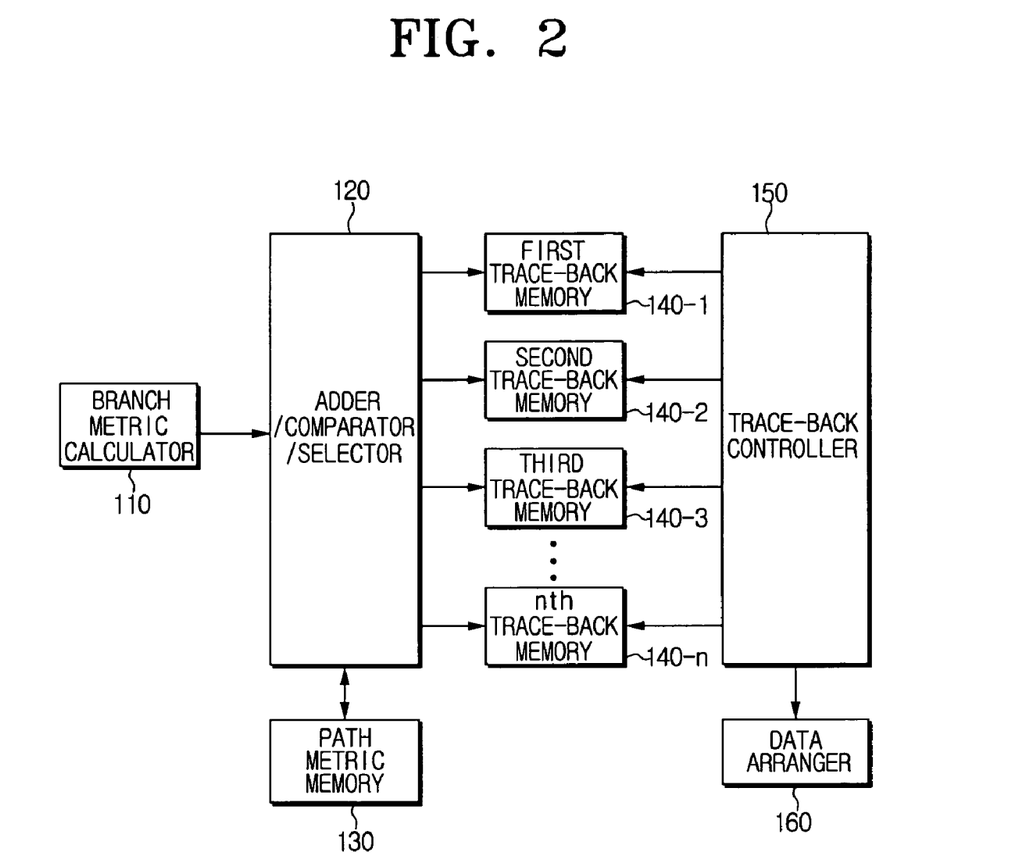
FIG. 2 is a block diagram of a Viterbi decoder according to an exemplary embodiment of the present invention.

FIG. 2 is a block diagram of a Viterbi decoder according to an exemplary embodiment of the present invention. Referring to FIG. 2, the Viterbi decoder includes a branch metric calculator 110, an adder/comparator/selector 120, a path metric memory 130, first through $n^{th}$ trace-back memories 140_1 through 140_n, a trace-back controller 150, and a data arranger 160.

The branch metric calculator 110 calculates a distance, i.e., a branch metric, between each branch code and each input code on a trellis diagram. The distance between each branch code and each input code is a Hamming distance in a case of hard-decision decoding, but a Euclidean distance in a case of soft-decision decoding. In detail, if a branch code is "00" and an input code is "01," a branch metric is "1."

The adder/comparator/selector 120 executes adding/comparing/selecting works. In other words, the adder/comparator/selector 120 adds the branch metrics calculated by the branch metric calculator 110 to a path metric of a previous state of the trellis diagram, compares the addition results, and selects a minimum value of the addition results. The adder/comparator/selector 120 may be embodied as a plurality of adders/comparators/selectors.

The path metric memory 130 stores path metrics detected by the adder/comparator/selector 120.

The first through $n^{th}$ trace-back memories 140_1 through 140_n sequentially store state transition values detected by the adder/comparator/selector 120.

The trace-back controller 150 executes a parallel trace-back work in each of the first through $n^{th}$ trace-back memories 140_1 through 140_n.

If the first through $n^{th}$ trace-back memories 140_1 through 140_n decode and output predetermined data sequences according to the trace-back work executed by the trace-back controller 150, the data arranger 160 arranges the predetermined data sequences to generate final decoded data.

The operation of the Viterbi decoder will now be described in detail.

It is supposed that path metrics of states a through d are all "0" at a time t0, and an input code is "01" at a time t1 on the trellis diagram shown in FIG. 1. In this state, a state c at the time t1 is connected to the states b and d at the time t0. Since a branch code of the state b is "10," a distance between the branch code and the input code "01," i.e., a branch metric, is "2." Thus, path metric "0" of state b at time t0+branch metric "2"=2. Since a branch code of the state d is "01," a distance between the branch code and the input code "01," i.e., a branch metric, is "0." Thus, path metric "0" of state d at time t0+branch metric "0"=0. As a result, the adder/comparator/selector 120 detects a path metric of the state c at the time t1 as "0." The adder/comparator/selector 120 stores detected path metrics in the path metric memory 130.

The path metric memory 130 includes a number of registers corresponding to a number of states. Thus, if a path metric of each state is detected, the path metric memory 130 updates a previous path metric.

Since a calculation result value obtained from a transition of the state d is a minimum value, a branch of the state d is selected. Since the branch of the state d is marked with a solid line, a state transition value is "1." The adder/comparator/selector 120 stores the state transition "1" in one of the first through $n^{th}$ trace-back memories 140_1 through 140_n.

In other words, if state transition values are sequentially detected as in "10010111," the adder/comparator/selector 120 sequentially stores the state transition values in the first through $n^{th}$ trace-back memories 140_1 through 140_n one by one according to the order of detecting the state transition values.

If the first through $n^{th}$ trace-back memories 140_1 through 140_n store the state transition values by a preset trace-back depth, the trace-back controller 150 executes a trace-back work. In this case, the trace-back work is executed in parallel in the first through $n^{th}$ trace-back memories 140_1 through 140_n. In other words, the trace-back controller 150 checks a final path metric of each of the states stored in the path metric memory 130 to select a minimum value. In this case, a path metric of each of the states at a previous processing node may be checked with reference to the state transition values stored in the first through $n^{th}$ trace-back memories 140_1 through 140_n. Thus, if the minimum path metric is traced back by the number of the first through $n^{th}$ trace-back memories 140_1 through 140_n, the trace-back work may be executed in the first through $n^{th}$ trace-back memories 140_1 through 140_n. A trace-back method and a method of arranging decoded data will be described later.

Figure 3:
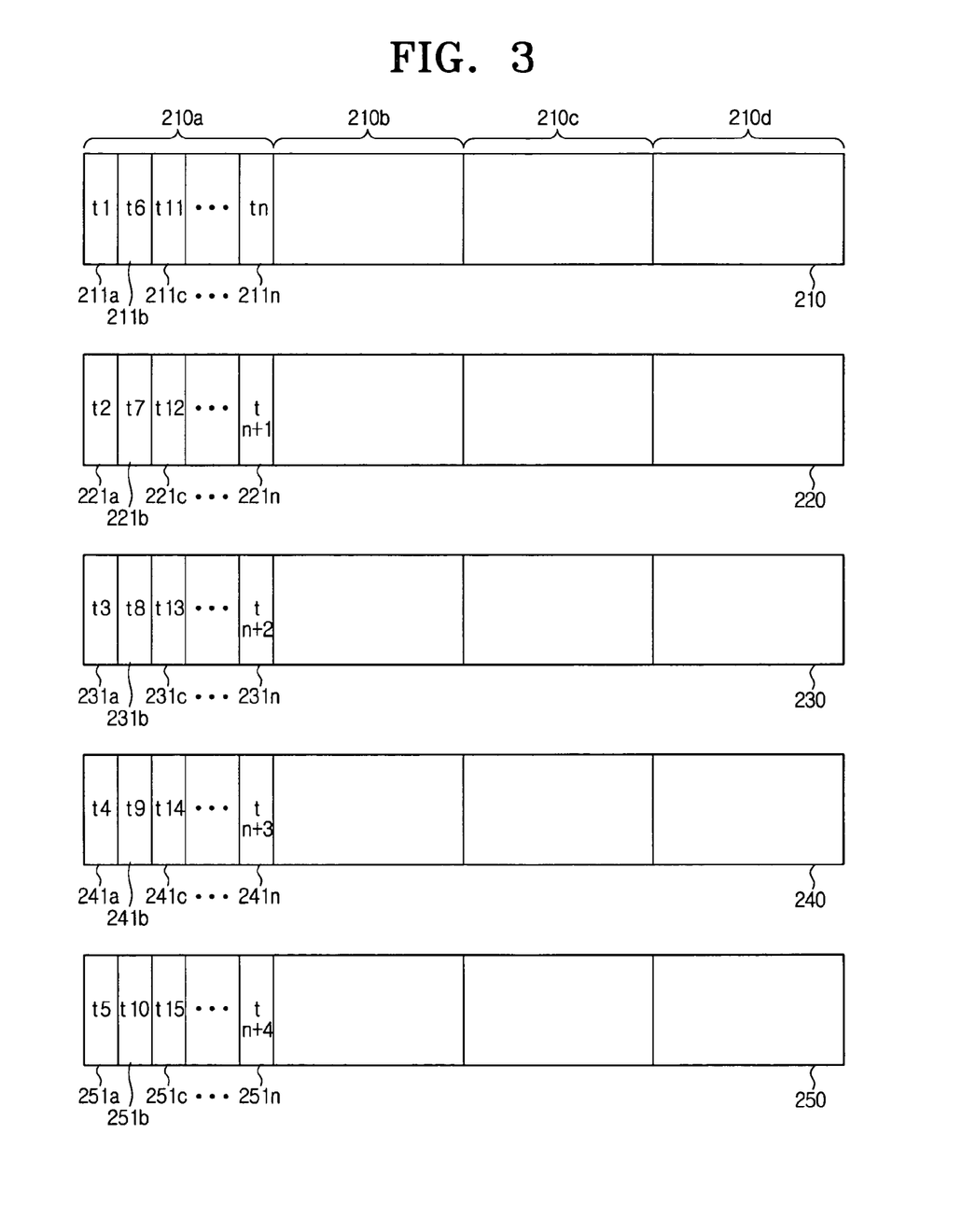
FIG. 3 is a schematic view of a plurality of trace-back memories used in the Viterbi decoder shown in FIG. 2.

FIG. 3 is a schematic view illustrating an exemplary process of storing state transition values in trace-back memories. Referring to FIG. 3, five trace-back memories 210 through 250 are embodied. The number of trace-back memories may be proportional to a constraint length. The constraint length indicates a number of inputs participating in outputs. Input codes to be decoded by a Viterbi decoder are codes coded by a convolution coder. In this case, the convolution coder includes registers to store input values. If a number of registers used in the convolution coder is m, a constraint length k=m+1. In other words, if a constraint length is K, a number of bits of an input signal may be K−1. Also, a maximum number of the first through $n^{th}$ trace-back memories 140_1 through 140_n may be K−3.

As shown in FIG. 3, the trace-back memory 210 is divided into four memory banks 210a through 210d. One of the memory banks 210a through 210d corresponds to a decoding area, another one corresponds to a data writing area, and the others correspond to trace-back areas. Each of the memory banks 210a through 210d may be divided into a plurality of memory cells 211a through 211n. Thus, a state transition value of each of the states on the trellis diagram is written in each of the memory cells 211a through 211n.

State transition values are sequentially detected from each processing node on the trellis diagram due to input codes input in real-time. For convenience, the state transition values detected from each processing node are transcribed as t1, t2, t3, ..., tn, tn+1, tn+2, tn+3, and tn+4. In other words, t1, t2, t3, ..., tn, tn+1, tn+2, tn+3, and tn+4 mean state transition values indicating transition paths through which states of a previous processing node are transitioned to states of a current processing node. If the first state transition value t1 is written in the first memory cell 211a of the first trace-back memory 210, the second state transition value t2 is written in a first memory cell 221a of a second trace-back memory 220. According to this exemplary method, all of the state transition values are sequentially stored in the first through fifth trace-back memories 210 through 250.

Figure 4:
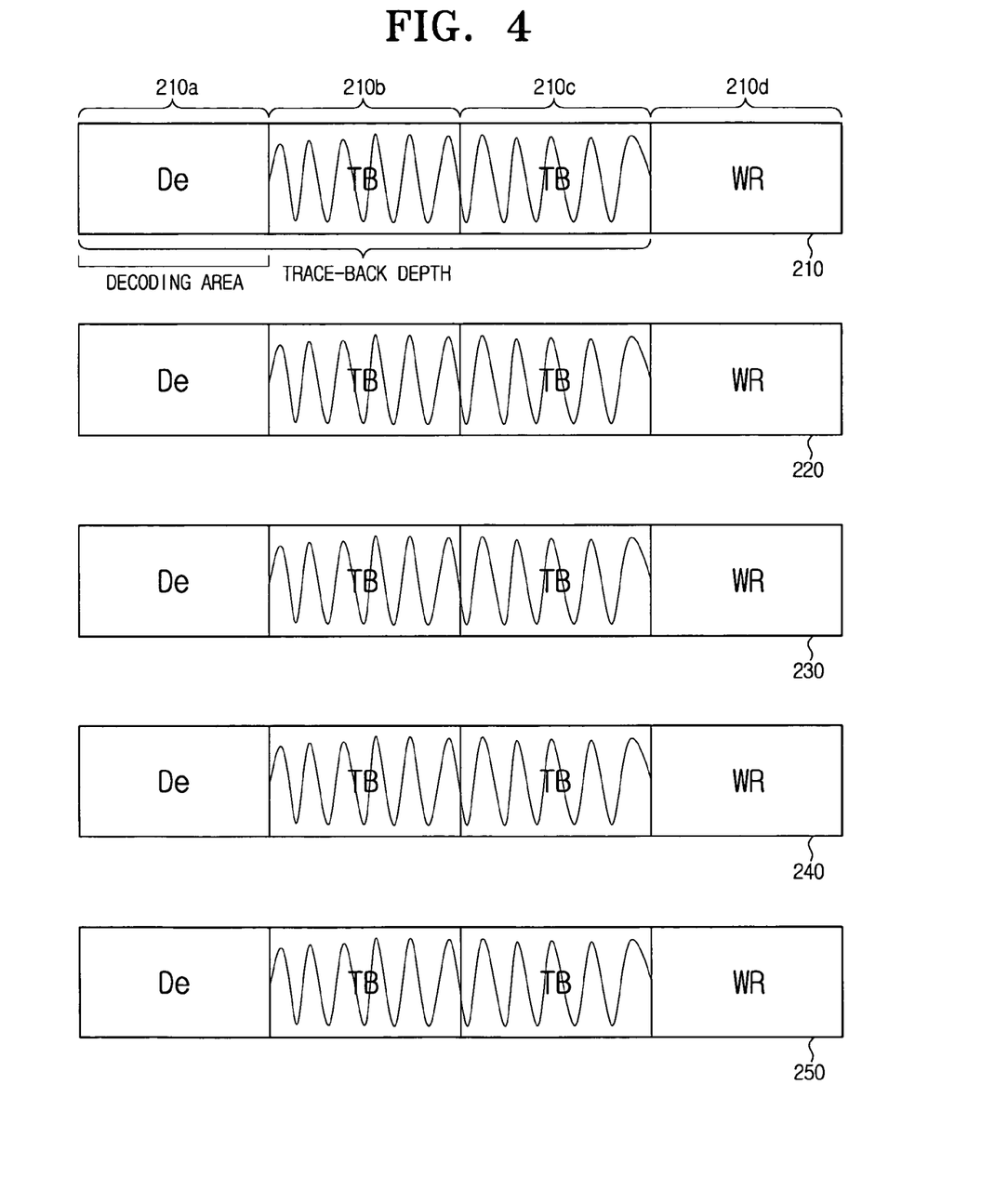
FIG. 4 is a schematic view illustrating a process of using the plurality of trace-back memories used in the Viterbi decoder shown in FIG. 2.

FIG. 4 is a schematic view illustrating a trace-back work and a decoding work executed in the first through fifth trace-back memories 210 through 250. Referring to FIG. 4, if the state transition values are stored in the first through fifth trace-back memories 210 through 250 by a preset trace-back depth, the trace-back controller 150 executes a trace-back (TB). To execute the TB, states having minimum path metrics are detected from the first through fifth trace-back memories 210 through 250. The TB is executed from the detected states. As shown in FIG. 4, three memory banks are set to a trace-back depth. In this case, if the TB is executed up to a predetermined depth, a point converging into an optimum path traced back in a previous step is detected. Thus, the TB being executed in a current step may stop to use the optimum path detected in the previous step. Such a point may be experimentally detected to preset a decoding depth.

As shown in FIG. 4, if two memory banks are TB areas, a memory bank is a decoding area De. In other words, a memory bank is set to a decoding depth. Thus, if a trace-back work is executed in parallel starting from an end of a third memory bank of each of the first through fifth trace-back memories 210 through 250, the trace-back work stops in a first memory bank area of each of the first through fifth trace-back memories 210 through 250. As a result, a plurality of bit values are decoded at a time from state transition values stored in the first memory banks. Therefore, the first memory bank of each of the first through fifth trace-back memories 210 through 250 is the decoding area De in which decoding is to be performed. Also, second and third memory banks are TB areas. State transition values corresponding to input codes input after a point of time when the TB is executed are stored in fourth memory banks. In other words, the fourth memory banks are data written areas WR. Thus, if writing is completed up to ends of the fourth memory banks, the TB is executed starting from the fourth memory banks so as to decode data written in the second memory banks. In other words, the third and fourth memory banks are TB areas, the second memory banks are decoding areas De, and the first memory banks are data written areas WR. The first through fifth trace-back memories 210 through 250 have circulating structures so as to repeat the above-described work.

Since state transition values are not consecutively written in each trace-back memory, state transition values written in the other trace-back memories must be checked during a trace-back work. This will be described later.

Compared to the first type of trace-back work, a trace-back work is executed in parallel one time to decode a plurality of data sequences. Thus, power consumption can be reduced. Compared to the second type of trace-back work, data is written in parallel in the plurality of trace-back memories 210 through 250. Thus, the state transition values output from the adder/comparator/selector 120 are written without being additionally delayed. An output speed of the adder/comparator/selector 120 is faster than a writing speed of trace-back memories. Thus, in the second type of trace-back work, a time delay occurs during writing of state transition values. As a result, a decoding speed is slow. However, according to exemplary embodiments of the present embodiment, such a problem is solved. In particular, in an exemplary embodiment, in a case where a plurality of adders/comparators/selectors 120 are embodied, a decoding speed may be remarkably increased.

Figure 5:
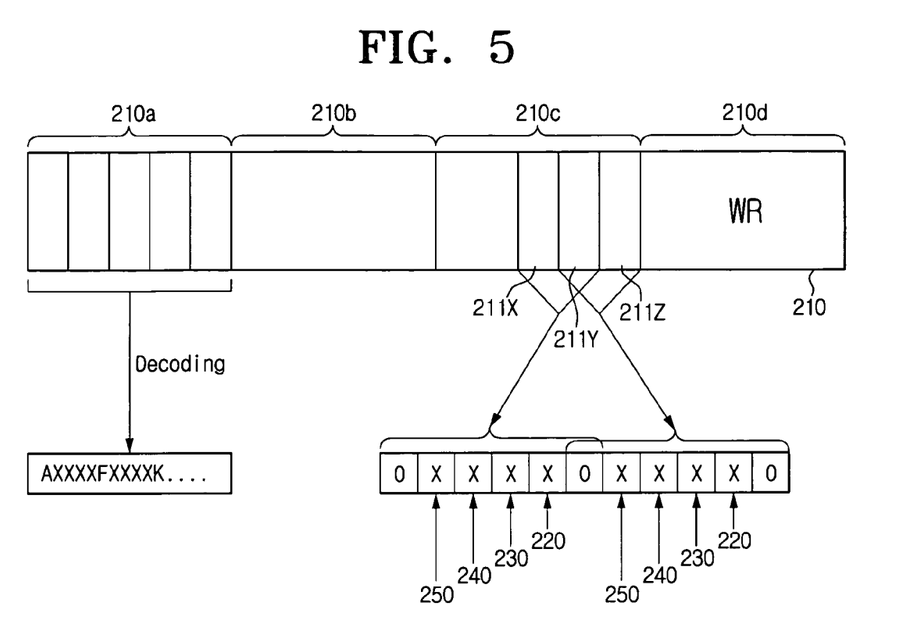
FIG. 5 is a schematic view illustrating a trace-back work executed in one trace-back memory.

FIG. 5 is a schematic view illustrating a trace-back work and a decoding work executed in the trace-back memory 210. Referring to FIG. 5, a trace-back work starts from a third memory bank 210c. Since the state transition values are sequentially written in the first trace-back memory 210 and also in the second through fifth trace-back memories 220 through 250 as described above, an optimum path may not be detected using only information stored in the first trace-back memory 210. In other words, four state transition values are required to detect an optimum path from a memory cell 211z of the third memory bank 210c to a memory cell 211y of the third memory bank 210c. Thus, state transition values written in the second through fifth trace-back memories 220 through 250 are sequentially referred to. If a state transition value is checked as "0" or "1," an optimum path with the previous processing node on the trellis diagram may be checked. As a result, if the trace-back work is executed up to the second memory bank 210b, state transition values of state transition values corresponding to the optimum path are output as a decoding data sequence.

Figure 6:
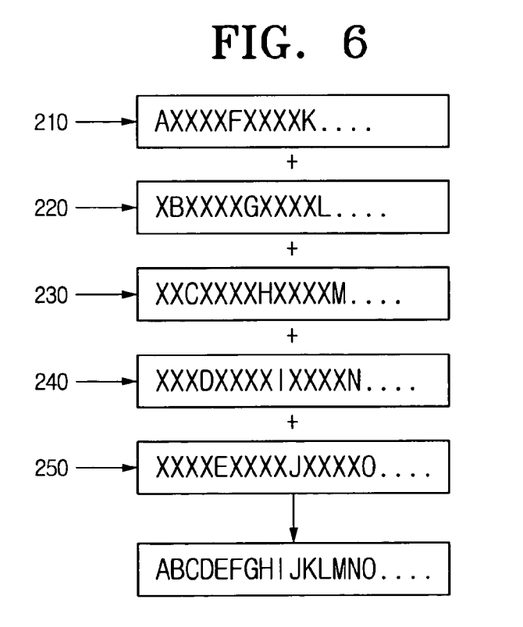
FIG. 6 is a schematic view illustrating a process of arranging values decoded from the plurality of trace-back memories to generate a final decoding value.

FIG. 6 is a schematic view illustrating a data sequence decoded from the first through fifth trace-back memories 210 through 250. Referring to FIG. 6, a data sequence decoded from the first trace-back memory 210 has a format such as AxxxxFxxxxK . . . . In other words, decoding is performed every 4-bit gap such as first, sixth, eleventh, and sixteenth bits.

Data sequences such as xBxxxxGxxxxL . . . , xxCxxxx-HxxxxM . . . , xxxDxxxxIxxxxN . . . , and xxxxExxxxJxxxx O . . . are decoded and output from the second through fifth trace-back memories 220 through 250, respectively.

The data arranger 160 arranges the data sequences decoded and output from each of the first through fifth trace-back memories 210 through 250 to generate a final decoding value "ABCDEFGHIJKLMNO . . . ."

Figure 7:
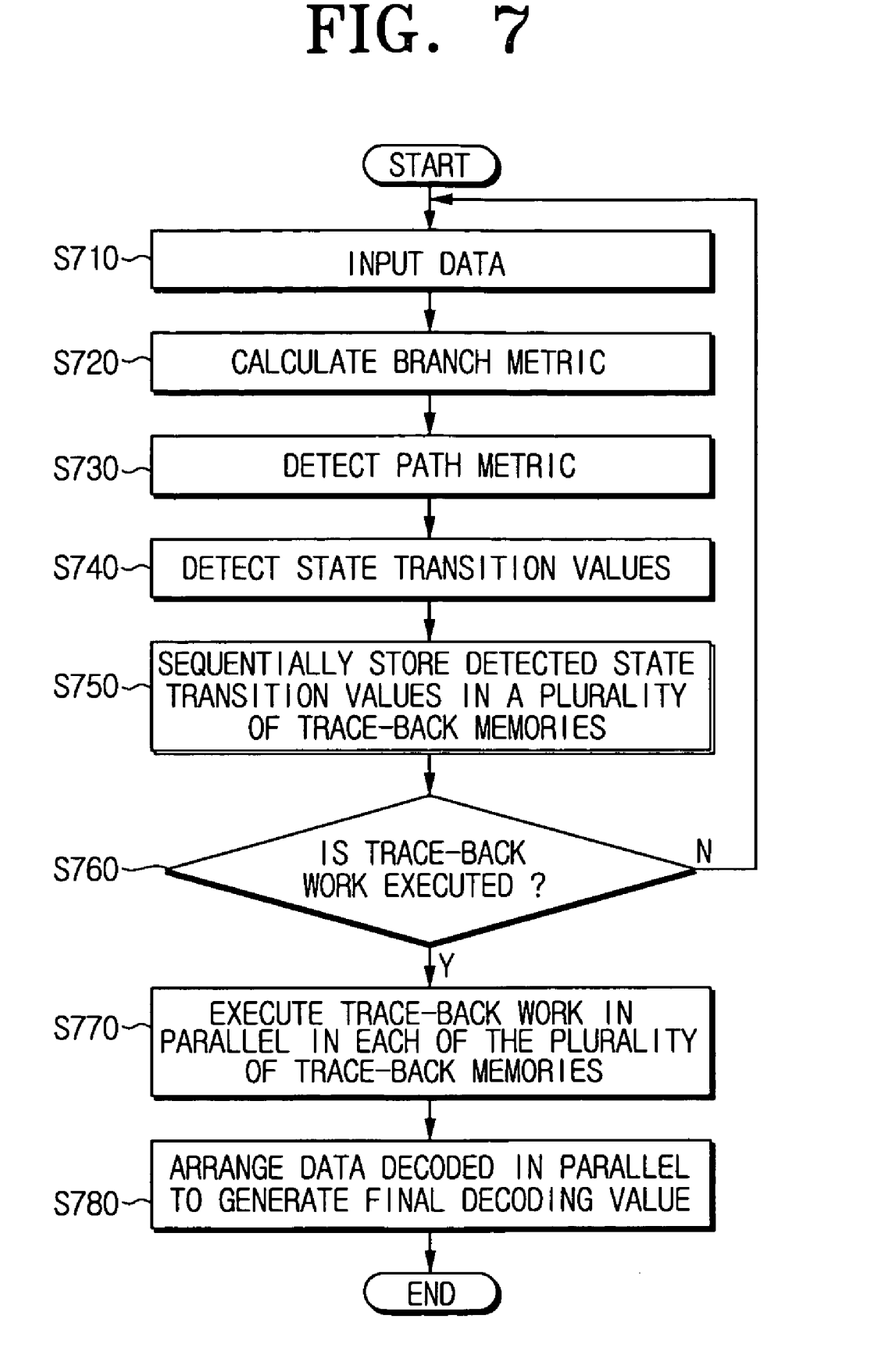
FIG. 7 is a flowchart of a decoding method executed by a Viterbi decoder according to an exemplary embodiment of the present invention.

FIG. 7 is a flowchart of a decoding method performed by a Viterbi decoder according to an exemplary embodiment of the present invention. Referring to FIG. 7, in operation S710, data is input. In operation S720, a branch metric of each state on a trellis diagram is calculated. In operation S730, a path metric of each state of a previous processing node is added to the branch metric and a minimum value is selected from the addition result values to detect a path metric of a current state.

In operation S740, a state transition value is detected from a branch having the selected minimum value. In operation S750, the detected state transition values are sequentially stored in the first through $n^{th}$ trace-back memories 140_1 through 140_n.

In operation S760, the trace-back controller 150 determines whether the state transition values are stored in the first through $n^{th}$ trace-back memories 140_1 through 140_n by a preset trace-back depth. If the state transition values are stored in the first through $n^{th}$ trace-back memories 140_1 through 140_n by the preset trace-back depth, a trace-back work is executed in parallel in each of the first through $n^{th}$ trace-back memories 140_1 through 140_n. In other words, a trace-back is executed in one trace-back memory with reference to state transition values stored in the other trace-back memories.

In operation S780, data sequences decoded and output from the first through $n^{th}$ trace-back memories 140_1 through 140_n are arranged to generate a final decoding value. In exemplary embodiments of the present embodiment, the adder/comparator/selector 120 detecting the path metric and the state transition values may be embodied as a plurality of adders/comparators/selectors. Also, a maximum number of trace-back memories may be K–3, where K is a constraint length.

As described above, in a Viterbi decoder for executing a trace-back work in parallel and a decoding method according to exemplary embodiments of the present invention, a plurality of trace-back memories can be used to execute a trace-back work. Thus, since the trace-back work can be executed in parallel, a decoding speed can be improved. As a result, a decoding throughput of the Viterbi decoder can be increased. Also, the trace-back work does not need to be executed whenever each bit value is decoded. Thus, power consumption can b reduced.

The foregoing embodiments are merely exemplary and are not to be construed as limiting the present invention. The present teaching can be readily applied to other types of apparatuses. Also, the description of the exemplary embodiments of the present invention is intended to be illustrative, and not to limit the scope of the claims, and many alternatives, modifications, and variations will be apparent to those skilled in the art.

What is claimed is:

1. A Viterbi decoder comprising:
a branch metric calculator which calculates a branch metric from a branch code passing each state on a trellis diagram and a predetermined input code;
at least one adder/comparator/selector which adds the branch metric to a path metric of a previous state, detects a minimum value of result values from the addition as a path metric of a current state, and detects state transition values corresponding to a path from which the minimum value has been detected;
a path metric memory which stores the path metric detected by the at least one adder/comparator/selector;
a plurality of trace-back memories which sequentially store the state transition values detected by the at least one adder/comparator/selector; and
a trace-back controller which, if the plurality of trace-back memories store the state transition values by a preset trace-back depth, executes a trace-back work in parallel in each of the plurality of trace-back memories.

2. The Viterbi decoder of claim 1, wherein the trace-back controller detects states having a minimum path metric from the plurality of trace-back memories to execute the trace-back work from the detected states.

3. The Viterbi decoder of claim 2, wherein if the trace-back controller executes the trace-back work in a first trace-back memory of the plurality of trace-back memories, the trace-back controller refers to state transition values stored in the other trace-back memories except the first trace-back memory.

4. The Viterbi decoder of claim 3, further comprising:
a data arranger which, if the trace-back work is executed in each of the plurality of trace-back memories to decode predetermined data sequences, arranges the predetermined data sequences in a predetermined order to generate a final decoding value.

5. The Viterbi decoder of claim 1, wherein each of the plurality of trace-back memories comprises:
a first memory bank in which a decoding work is executed;
second and third memory banks in which the trace-back work is executed; and
a fourth memory bank storing state transition values corresponding to input codes received after the trace-back work is executed.

6. The Viterbi decoder of claim 5, wherein if the trace-back work is executed in each of the plurality of trace-back memories by a preset decoding depth, the trace-back controller stops the trace-back work and executes a decoding work starting from a point of time when the trace-back work stops.

7. The Viterbi decoder of claim 6, wherein if a constraint length from the trellis diagram is K, a maximum number of the plurality of trace-back memories is K-3, wherein K is an integer and is greater than 3.

8. A decoding method executed by a Viterbi decoder comprising a plurality of trace-back memories, the method comprising:
calculating a branch metric from a branch code passing each state on a trellis diagram and a predetermined input code;
adding the branch metric to a path metric of a previous state and detecting a minimum value of result values from the addition as a path metric of a current state;
detecting state transition values corresponding to a path from which the minimum value has been detected;
sequentially storing the state transition values in the plurality of trace-back memories; and
if the state transition values are stored in the plurality of trace-back memories by a preset trace-back depth, executing a trace-back work in parallel in each of the plurality of trace-back memories.

9. The decoding method of claim 8, wherein states having a minimum path metric are detected from each of the plurality of trace-back memories to execute the trace-back work from the detected states.

10. The decoding method of claim 9, wherein if the trace-back work is executed in a first trace-back memory of the plurality of trace-back memories, state transition values stored in the other trace-back memories except the first trace-back memory are referred to.

11. The decoding method of claim 10, further comprising:
stopping the trace-back work and executing a decoding work starting from a point of time when the trace-back work stops if the trace-back work is executed in each of the plurality of trace-back memories by a preset decoding depth.

12. The decoding method of claim 8, further comprising:
arranging predetermined data sequences in a predetermined order to generate a final decoding value if the trace-back work is executed in each of the plurality of trace-back memories to decode the predetermined data sequences.

13. The decoding method of claim 8, wherein each of the plurality of trace-back memories executes a decoding work in a first memory bank, executes the trace-back work in second and third memory banks, and stores in a fourth memory bank state transition values corresponding to input codes received after the trace-back work is executed.

14. The decoding method of claim 8, wherein if a constraint length from the trellis diagram is K, a maximum number of the plurality of trace-back memories is K-3, wherein K is an integer and is greater than 3.

* * * * *